United States Patent [19]

Kato et al.

[11] Patent Number: 5,073,726
[45] Date of Patent: Dec. 17, 1991

[54] INPUT CIRCUIT OF SEMICONDUCTOR INTEGRATED CIRCUIT AND SEMICONDUCTOR INTEGRATED CIRCUIT HAVING INPUT CIRCUIT

[75] Inventors: Hideo Kato, Kawasaki; Shinichi Kikuchi, Yokohama; Hiroto Nakai, Kawasaki; Hiroshi Iwahashi, Yokohama, all of Japan

[73] Assignee: Kabushiki Kaisha Toshiba, Kawasaki, Japan

[21] Appl. No.: 559,139

[22] Filed: Jul. 30, 1990

[30] Foreign Application Priority Data

Jul. 28, 1989 [JP] Japan .................................. 1-195951

[51] Int. Cl.⁵ ........................................... H03K 19/017
[52] U.S. Cl. .................................... 307/443; 307/451; 307/475; 307/579; 307/279
[58] Field of Search ............... 307/443, 451, 450, 475, 307/579, 279, 585

[56] References Cited

U.S. PATENT DOCUMENTS

| 4,250,406 | 2/1981 | Alaspa | 307/279 |
| 4,525,640 | 6/1985 | Boyle et al. | 307/450 |
| 4,532,439 | 7/1985 | Koike | 307/451 |
| 4,584,491 | 4/1986 | Ulmer | 307/475 |
| 4,682,055 | 7/1987 | Upadhyayula | 307/443 |

FOREIGN PATENT DOCUMENTS 0350879 7/1989 European Pat. Off. .

OTHER PUBLICATIONS

R. D. Jolly, et al., "A 35-ns 64K EEPROM", IEEE Journal of Solid-State Circuits, vol. SC-20, No. 5, Oct. 1985, pp. 971-978.
Patent Abstracts of Japan, vol. 6, No. 81, 19th May 1982 & JP-A-57 17 223.

Primary Examiner—Stanley D. Miller
Assistant Examiner—Scott A. Ouellette
Attorney, Agent, or Firm—Foley & Lardner

[57] ABSTRACT

There is disclosed a semiconductor integrated circuit provided with an input circuit including an N-channel MOS transistor of which threshold voltage is set to a value lower than those of N-channel MOS transistors constituting other internal circuits of the integrated circuit. Thus, a circuit having a high operating margin for power supply noises is provided. This circuit further comprises a P-channel MOS transistor constituting a portion of a NOR gate or a NAND gate together with the above-mentioned N-channel MOS transistor.

11 Claims, 4 Drawing Sheets

[5,073,726](1)(2)

INPUT CIRCUIT OF SEMICONDUCTOR INTEGRATED CIRCUIT AND SEMICONDUCTOR INTEGRATED CIRCUIT HAVING INPUT CIRCUIT

BACKGROUND OF THE INVENTION

This invention relates to a semiconductor integrated circuit, and more particularly to an input buffer capable fo preventing an erroneous operation occurring in an integrated circuit resulting from changes in a power supply potential or a ground potential produced at the time of outputting data.

In semiconductor integrated circuits, e.g., semiconductor memories, etc. there are instances where a large capacitor existing at the external, e.g., a load capacitor of about 100 pF is driven by an output buffer for outputting internal data to the external. The transistors of the output stage in the output buffer circuit have an extremely large current drive ability to charge or discharge in a short time the load capacitor.

FIG. 5 is a circuit diagram showing an example of an output buffer circuit 50 as mentioned above.

Internal data Di of the integrated circuit is applied to the input terminal 51 of the output buffer circuit 50. This output buffer circuit is in an enabling state, when the output enable signal OE1 and its ivnerted signal $\overline{OE1}$ are a logic "1" and a logic "0", respectively. A P-channel MOS transistor 52 and an N-channel mOS transistor 53 which are controlled by the inverted signal $\overline{OE1}$ are turned ON and OFF, respectively. The internal data Di is delivered to the gate of the P-channel MOS transistor 58 of the output stage through a substantial CMOS inverter comprised of a P-channel MOS transistor 54 and an N-channel MOS transistor 55 and a CMOS inverter comprised of a P-channel MOS transistor 56 and an N-channel MOS transistor 57 in order recited.

An N-channel MOS transistor 59 and a P-channel MOS transistor 60 which are controlled by the signal OE1 are turned ON and OFF, respectively. The internal data Di is delivered to the gate of an N-channel MOS transistor 65 of the output stage through a substantial CMOS inverter comprised of a P-channel MOS transistor 61 and an N-channel MOS transistor 62 and a CMOS inverter comprised of a P-channel MOS transistor 63 and an N-channel MOS transistor 64 in the order recited. The source of the transistor 58 of the output stage and the source of the transistor 65 of the output stage are connected to a positive power supply potential Vcc and a ground potential Vss, respectively, and the drains of the both transistors are commonly connected to the output terminal 66. A load capacitor 67 is connected to the output terminal 66.

In such an output buffer circuit, either of the transistors 58 and 65 of the respective output stages is turned ON in dependency upon the logic level of the internal data Di. When the transistor 58 is turned ON, the ouput terminal 66 is charged toward the power supply potential Vcc through the transistor 58 in an ON state, while when the transistor 65 is turned ON, the output terminal 66 is discharged toward the ground potential Vss. To rapidly charge and discharge the output terminal 66 connected an external large load capacitor 67, the current drive capability of each of the transistors 58 and 65 is large.

The power supply potential Vcc and the ground potential Vss are respectively delivered to this integrated circuit through the wiring L1 and L2 applied fro mpower source unit 70. The wiring L1 and L2 contain parasitic inductances 71 ad 72, respectively. Because of the presence of those inductances, the power supply potential Vcc and the ground potential Vss in this integrated circuit is varied, when the current Is or It (shown in FIG. 5) flows through the transistor 58 or 65 respectively for charging or discharging of the output terminal 66. Namely, when the value of each inductance 71 and 72 existing in the wiring and a ratio of changes in time of a current flowing in these wiring are designated by L and di/dt, respectively, a potential change Δv expressed as the following equation occurs:

$$\Delta v = L \cdot di/dt \quad (1)$$

FIG. 6 is a waveform diagram showing the voltage and current waveforms of respective componnts in the output buffer circuit 50. In this waveform diagram, Va repressnts a gate potential of the P-channel MOS transistor 58 of the output stage, Vb a gate potential of the N-channel MOS transistor 65 of the output stage, Is a drain current (charge current) of the P-channel MOS transistor 58, and It a drain current (discharge current) of the N-channel MOS transistor 65.

As shown in FIG. 6, after the logic level of the internal data Di has changed, the gate potential Va of the P-channel MOS transistor 58 and the gate potential Vb of the N-channel MOS transistor 58 and the output stage change. Thus, these transistors 58 and 65 carry out switching operations, respectively. As a result, a drain current Is of the transistor 58 or a drain current It of the transistor 65 flows. Thus, a change in the Vcc potential or the Vss potential would occur by the flowing of this large current Is or It.

As stated above, as the result of the fact that a large current flows when data is outputted from the output buffer circuit, a potential change (hereinafter refered to as a power supply noise) in the power supply voltage Vcc and the ground potential Vss occurs inside the integrated circuit. This potential change may cause an erroneous operation in the integrated circuit. Where it is required to charge or discharge the external load capacitor in a shorter time for improvement of the high speed characteristic, such an erroneous operation caused by the charge/discharge current for the load capacitor is increasingly apt to take place because a larger current is required to flow.

SUMMARY OF THE INVENTION

Accordingly, an object of this invention is to provide a semiconductor integrated circuit provided with an input buffer circuit, which has a high operating margin with respect to power supply noises, and which has an improved operating margin than that of the prior art with respect to changes in a power supply potential or a ground potential at the time of outputting data.

According to the present invention, there is provided a semiconductor integrated circuit comprising, as a portion of an input circuit, a first drive MOS transistor of the N-channel type of which gate electrode is connected to an external signal input terminal, characterized in that a threshold voltage of said first drive MOS transistor is set to a value lower than a threshold voltage of a second drive MOS transistor of the N-channel type constituting each of other internal circuits of said integrated circuit.

In accordance with this invention, the threshold voltage of an N-channel MOS transistor constituting the input circuit of the integrated circuit is set to a value lower than the threshold voltage of each drive N-channel MOS transistor constituting other internal circuits of the integrated circuit. When the ground potential Vss changes, the current flowing through the first drive MOS transistor changes. A current value is proprtional to the square of a voltage difference between the gate voltage and the threshold voltage of the MOS transistor at the pentode region of the MOS transistor.

Since the threshold voltage of the first drive MOS transistor is lower than that of a conventional circuit, the changing rate of the current flowing the first drive MOS transistor is smaller than that of the conventional circuit at the changing of the ground potential Vss. Consequently, an erroneous operation in the output buffer circuit does not occur.

DESCRIPTION OF THE PREFERRED EMBODIMENTS

Several embodiments of this invention will now be described in detail with reference to the attached drawings.

Figure 1:
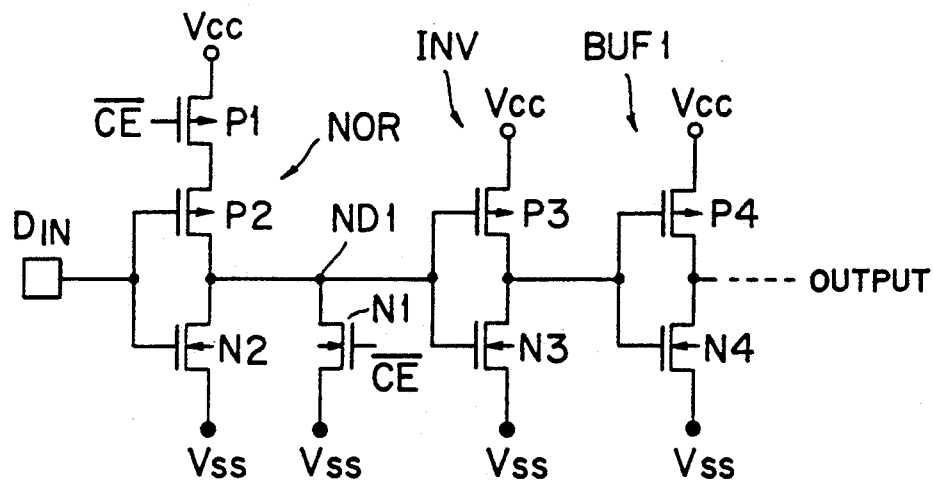
FIG. 1 is a circuit diagram showing an embodiment of a semiconductor integrated circuit according to this invention.

FIG. 1 is a circuit diagram showing an input buffer circuit according to an embodiment of the invention of this application.

In this circuit, the first stage input gate is constructed as a two-input CMOS NOR gate NOR. This NOR gate comprises a P-channel MOS transistor P1, a P-channel MOS transistor P2, an N-channel MOS transistor N1, and an N-channel MOS transistor N2. The transistor P1, P2 and N2 are connected in series between the power supply potential terminal Vcc and the ground potential terminal Vss, wherein an internal chip enable signal $\overline{CE}$ for controlling the operating state of this integrated circuit is applied to the gate of the P-channel MOS transistor P1, and an external input signal Din is applied to the respective gates of the P-channel MOS transistor P2 and the N-channel MOS transistor N2. The N-channel MOS transistor N1 is connected in parallel with the N-channel MOS transistor N2, wherein the internal chip enable signal $\overline{CE}$ is applied to the gate of the N-channel MOS transistor N1. The external input signal Din is output data from other integrated circuits. A CMOS inverter INV is connected to the succeeding stage of the NOR gate NOR. This CMOS inverter INV is of a structure comprising a P-channel MOS transistor P3 and an N-channel MOS transistor N3 connected in series between the power supply potential terminal Vcc and the ground poential terminal Vss. Furthermore, a buffer circuit BUF1 is connected to the succeeding stage of the CMOS inverter INV. This buffer circuit BUF1 is also comprised of a CMOS inverter comprising a P-channel MOS transistor P4 and an N-channel MOS transistor N4 connected in series between the power supply potential terminal Vcc and the ground potential terminal Vss. The sizes of the transistors P4 and N4 are determined so that a load capacitance existing in the output of the buffer BUF1 can be rapidly charged and discharged. It it sto be noted that while a single buffer circuit is provided in the above-mentioned embodiment, a plurality of buffer circuits may be provided according to need.

Furthermore, the threshold voltage of the N-channel MOS transistor N2 included in the first stage input gate for receiving a signal Din from the external is lower than those of other N-channel MOS transistors N1 and N3, e.g., substantially zero volts.

The operation of the embodiment according to this invention having such a circuit configuration will now be described.

Power noises as previously described occur when the internal data of the integrated circuit are outputted to the external. The power supply noise takes place inside the integrated circuit, so a potential of Vcc or Vss of this integrated circuit changes. However, the potential level of the input data applied to the input circuit of the integrated circuit does not change.

Generally, in the semiconductor integrated circuit, a voltage lower than 2.0 volts is a logic "0". For this reason, when outputting data to the external, a potential of the output data less than 0.8 volts for data "0" and is more than 2.0 volts for data "1". In consideration of such a relationship, the boundary between a logic "0" and a logic "1" is provided, e.g., in the vicinity of 1.5 volts in the circuit section for receiving such data. Thus, the input circuit is designed so that input data having a potential less than 1.5 volts and input data having a potential more than 1.5 volts are judged to be a logic "0" and a logic "1", respectively. Also in this embodiment, the voltage value at the boundary between the logic "0" and the logic "1" is assumed to be set to 1.5 volts in the same manner as in the prior art.

Figure 4:
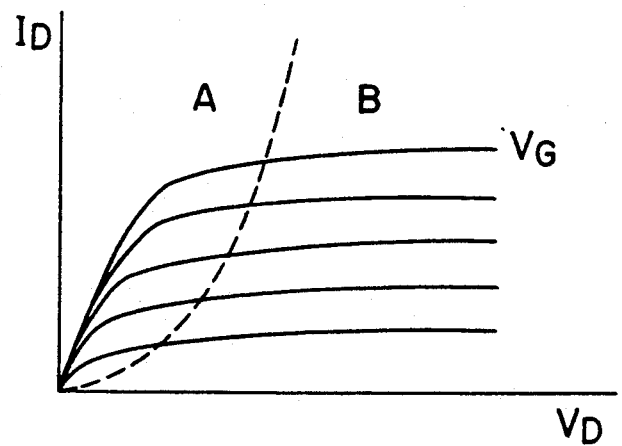
FIG. 4 is a graph showing a voltage-current characteristic of an N-channel MOS transistor.
Figure 5:
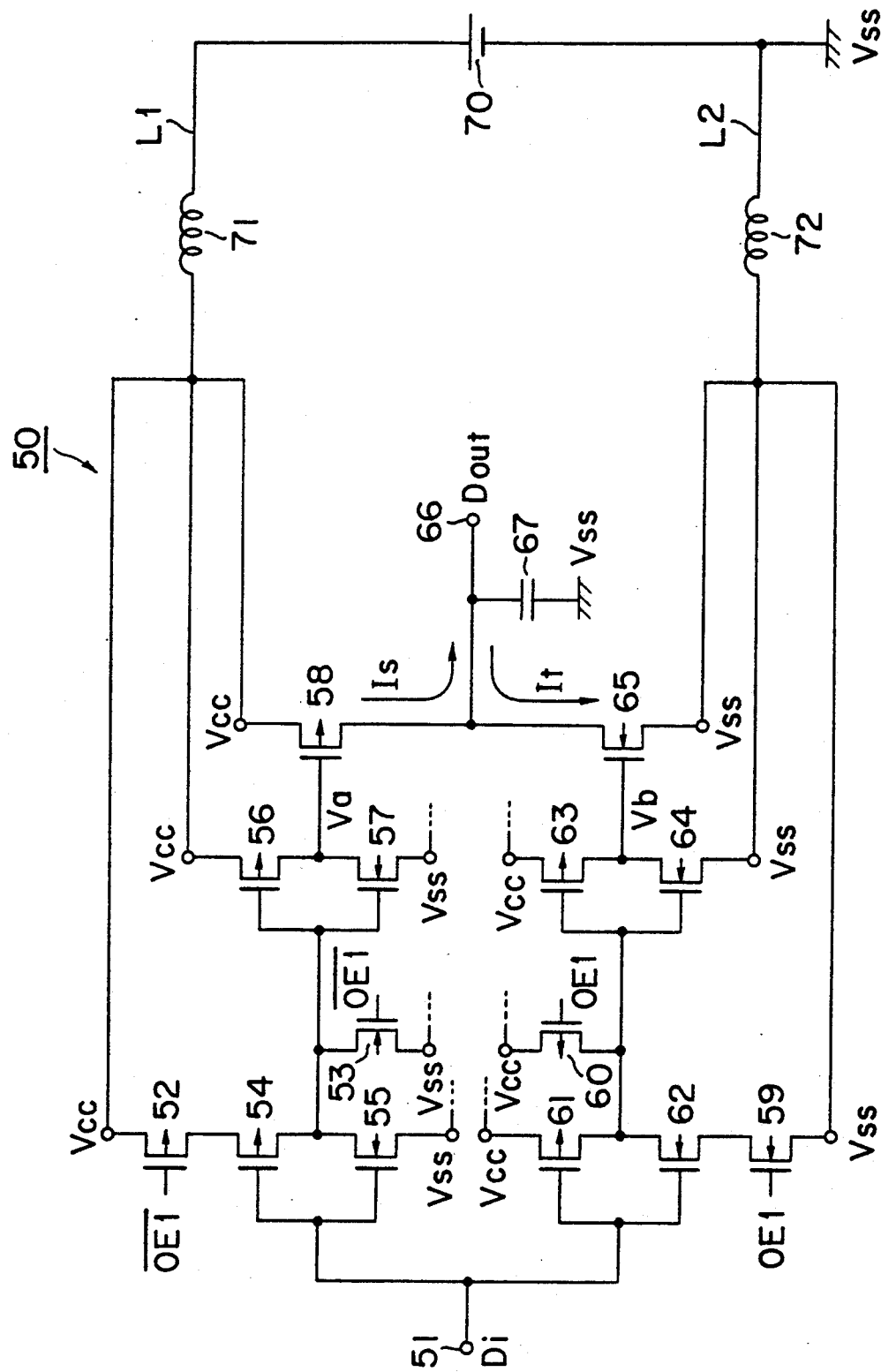
FIG. 5 is a circuit diagram showing a conventional output buffer circuit for explaining the occurrence of power supply noise.
Figure 6:
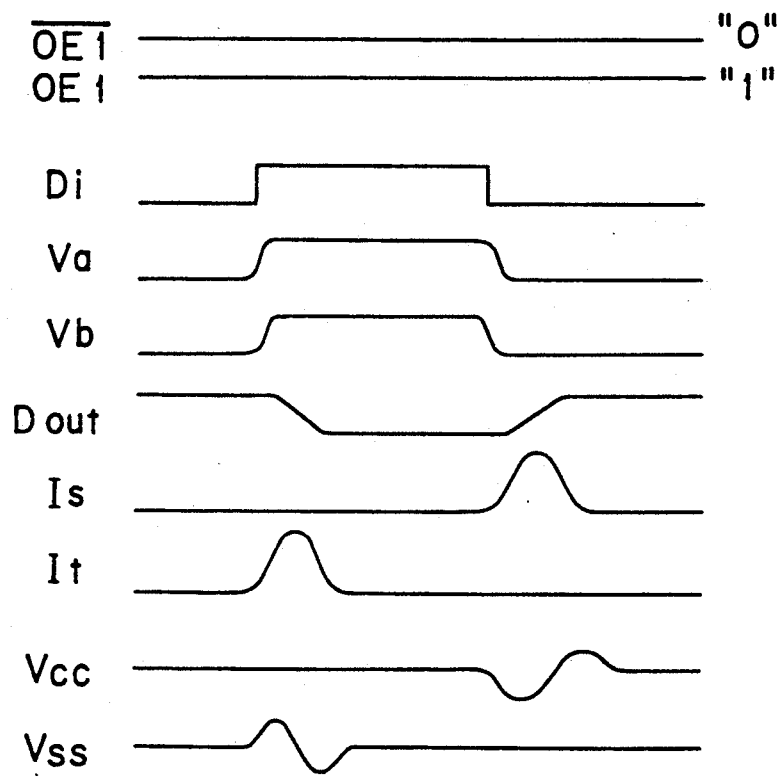
FIG. 6 is a waveform diagram showing waveforms of the respective components of FIG. 5.

It is now assumed that data having a potential of 1.5 volts which is the boundary between the logic "0" and the logic "1" is applied to the input terminal. When the power supply potential Vcc is 5 volts, assuming that a potential on the output node ND1 of the input first stage, which is the junction where the respective drains of the transistors P2, N2 and N1 are commonly connected, is 2.5 volts, the transistor N2 of the input first stage operates in a pentode region (saturation region) B shown in FIG. 4. This pentode region is a region where the following equation holds when the gate voltage, the threshold voltage, and the drain voltage are represented by $V_G$, Vth and $V_D$, respectively:

$$V_G - \text{Vth} < V_D \tag{2}$$

It is known that a current value Id of the pentode operation of the MOS transistor is given by the following equation:

$$I_D = \frac{\beta}{2}(V_G - Vth)^2, \tag{3}$$

where $\beta$ is a constant determined by the size, and the carrier mobility, etc. of the transistor.

Lets now consider the case where the threshold voltage of the transistor N2 is zero volts.

Assuming that a current flowing in the transistor N2 when a voltage of 1.5 volts is applied to the input terminal is represented by $I_{D1}$, substitution of numeric values into the equation (3) gives the following relationship:

$$I_{D1} = \frac{1}{2} \cdot \beta_1 (1.5 - 0)^2 = \frac{9}{8} \cdot \beta_1$$

Where an ordinary enhancement type transistor having a threshold voltage of 1 volt is used as the transistor N2, the above relationship is expressed as follows:

$$I_{DE} = \frac{1}{2} \cdot \beta_E (1.5 - 1)^2 = \frac{1}{8} \cdot \beta_E$$

In the case where the voltage value at the boundary between a logic "0" and a logic "1" is 1.5 volts, when the sizes of P-channel transistors P1 and P2 are the same size as in the prior art, the drain current $I_{DE}$ at the 1.5 volts of external input signal is equal to the drain current $I_{DI}$ at the 1.5 volts of an external input terminal. The following relationship holds:

$$\frac{1}{8} \beta_E = \frac{9}{8} \beta_1$$

Namely, $$\beta_1 = \frac{1}{9} \beta_E$$

This indicates the following fact. Namely, since the threshold voltage of the transistor N2 is set to a low value, for making a design so that a voltage at the boundary between the logic "0" and the logic "1" is equal to 1.5 volts in the same manner as in the prior art, the channel width of the transistor N2 according to the invention of this application can be reduced to a value which is one ninth of that of the enhancement type transistor having a threshold value of 1 volt.

Let now consider the operation when the ground potential Vss has changed.

It is now assumed that when input data of a logic "0" of 0.8 volts is applied, the ground potential Vss has changed to $-2.2$ volts. In this case, since the ground potential Vss is taken as a reference, this state is equivalent to the state where the gate potential of the transistor N2 has risen up to 3.0 volts. Consequently, currents $I_{DE}$ and $I_{DI}$ flowing in the case where the threshold voltage of the transistor N2 are 1 volt and zero volts, respectively, can be expressed as follows:

$$I_{DE} = \frac{1}{2} \cdot \beta_E (3.0 - 1)^2 = 2 \cdot \beta_E$$

$$I_{D1} = \frac{1}{2} \cdot \beta_1 (3.0 - 0)^2 = \frac{9}{2} \beta_1 = \frac{1}{2} \cdot \beta_E = \frac{1}{4} I_{DE}$$

From these relationships, in accordance with this invention, when the ground potential Vss has changed, a current flowing in the transistor N2 becomes one fourth of the current $I_{DE}$ when the threshold voltage is 1 volt. Accordingly, when the ground potential Vss changes in a negative direction, the discharge rate of a potential on the node ND1 becomes slower than that of the prior art. For this reason, it is apparent that data change of the node ND1 is difficult to occur, resulting in improved tolerance against an erroneous operation.

Lets now consider the case where an input signal DIN has normally changed from a logic "0" to a logic "1". Here, as the worst case, attention is drawn to the case where the input signal DIN has changed to a potential of 2 volts of the minimum value which can be considered to be a logic "1". At this time, currents $I_{DE}$ and $I_{DI}$ flowing in the case where the threshold voltage of the transistor N2 are respectively 1 volt and zero volts can be expressed as follows:

$$I_{DE} = \frac{1}{2} \cdot \beta_E (2 - 1)^2 = \frac{1}{2} \cdot \beta_E$$

$$I_{D1} = \frac{1}{2} \cdot \beta_1 (2 - 0)^2 = \frac{1}{18} \beta_E \cdot 4 = \frac{2}{9} \cdot \beta_E$$

Accordingly, the ratio therebetween is as follows:

$$\frac{I_{D1}}{I_{DE}} = \frac{\frac{2}{9} \cdot \beta_E}{\frac{1}{2} \cdot \beta_E} = \frac{4}{9} = \frac{1}{2.25}$$

Thus, the current flowing in the transistor N2 having a threshold voltage of zero volts become 1/2.25 of the current flowing in the transistor having a threshold voltage of 1 volt. Accordingly, the discharge rate of a potential on the node ND1 becomes slow as compared to that of the prior art. However, the degree of this change is small when compared to the ¼]of the degree of change of the ground potential Vss previously described.

In connection with this, in the prior art, a load capacitor is connected to the node ND1 to allow a discharge rate of a potential on the node ND1 to be slow when the ground potential Vss has changed, to thus improve the noise immunity. However, in the prior art, in order to ensure the same noise margin as in the case of this invention shown in FIG. 1, it is necessary that the node ND1 have a load capacitance four times larger than in the case of FIG. 1. However, since a current flowing in the transistor N2 having a threshold value of 1 volt is 2.25 times larger than a current flowing in the transistor N2 having a threshold value of zero volts at the time of a normal operation, the response speed at the time of a normal operation in the above-described conventional case where a quadruple load capacitor is connected becomes slower than that in the case of the invention of this application.

Lets now consider the case where when the input Data DIN is 2 volts of a logic "1", the ground potential Vss has changed in a positive direction. In this case, when the ground potential Vss has changed by more than +2 volts, the transistor N2 is to be turned OFF even if its threshold value is 1 volt or zero volts. Therefore, the influences by the Vss change are considered to be equal to each other. Accordingly, it is now assumed that the ground potential Vss has changed by +1.5 volts.

At this time, where the transistor N2 has a threshold voltage of 1 volt, it is turned OFF. However, since the threshold voltage of the transistor N2 is zero volts in the case of FIG. 1, the transistor N2 remains in an ON state.

Thus, when the ground potential Vss has changed in a positive direction, in the case of this invention shown in FIG. 1, the node ND1 is discharged by the transistor N2 while charging by the transistors P2 and P1. On the contrary, in the case where the threshold voltage of the transistor N2 is 1 volt, the node ND1 is only charged by the transistors P2 and P1. As a result, the rising rate of the potential on the node ND1 in the case of this invention becomes considerably slow when compared to the case of the threshold voltage of 1 volt. For this reason, erroneous operation is more difficult to occur when compared to the prior art.

As stated above, by lowering the threshold voltage of the transistor of the input first stage, in the case where various power supply changes occur, data change of the node ND1 becomes difficult to react with such noises, so the influence on the succeeding stage is reduced. Thus, erroneous operation becomes difficult to occur, resulting in an increased margin with respect to power noise.

Conversely, if the occurrence rate of erroneous operation is the same degree as in the prior art by making use of such an increased margin, it is also possible to allow the charging and discharging speed at the output terminal to be faster than in the prior art to get a high speed operation.

This noise margin is effectively provided if the condition that the threshold voltage of the transistor N2 is lower than respective threshold voltages of N-channel MOS transistors constituting other internal circuits is satisfied. Generally, this margin increases as the threshold voltage of the transistor N2 takes a lower value. For this reason, it is more desirable to employ substantially zero volts or less as the threshold voltage of the transistor N2. It is to be noted that since the optimally lowered value of the threshold voltage varies depending upon the size and/or structure of the transistor, it is suitably selected in view of these facts.

The reason why even when the threshold voltage is lowered, the transistor having such a lowered threshold voltage conducts a complete operation as the drive transistor of the input first stage is comprehended from the following. Namely, in recent years, the gate oxide film of the transistor has become thin to the extent such that its thickness is about 200 Å with the progress of the fining processing technology. Thus, an electric field when, e.g., a gate voltage of 1 volt is applied to the gate oxide film having such a thickness is equivalent to an electric field when a gate voltage of 5 volts is applied to the conventional gate oxide film, e.g., having a thickness of 1000 Å.

In accordance with the experiment by the inventors, the following fact was confirmed. Namely, while erroneous operation due to power supply noise occurred with the circuit of the conventional structure, no erroneous operation was produced with respect to the same power supply noise when there is employed a circuit of the structure shown in FIG. 1 in which setting is made such that the threshold voltage of the transistor N2 is lowered to substantially zero volts.

The threshold voltage of the transistor is determined by a quantity of ions implanted into the channel portion. When a semiconductor substrate of, e.g., about 5 to 20 ohms/cm is used, a transistor having a threshold voltage in the vicinity of zero volts can be realized without carrying out an ion implantation for channel.

It is to be noted that where the internal circuit is of CMOS structure, low power consumption is required, and since a current consumption of substantial zero is required particularly in a standby state, it is desirable that the threshold voltage be generally high. Since control is conducted in a standby state to set the signal $\overline{CE}$ to "1" to allow the transistor P1 to be turned OFF, the current consumption can be equal to zero even if a transistor having a threshold voltage in the vicinity of zero volts is used as the input first stage.

Figure 2:
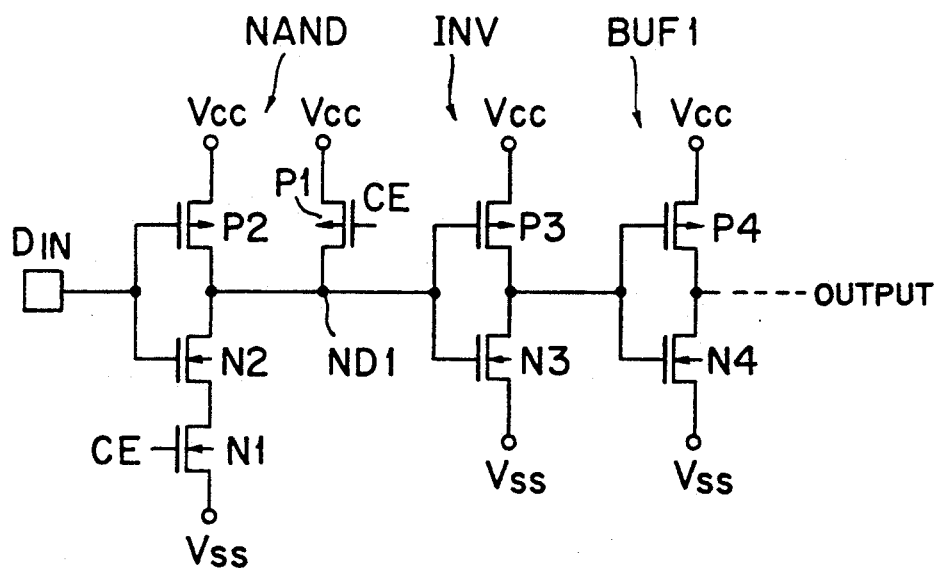
FIG. 2 is a circuit diagram showing another embodiment of this invention.

FIG. 2 is a circuit diagram showing another embodiment of this invention. In this embodiment, a first stage input gate of NAND type is used. The operation in this case is the same as that in the case of the NOR gate shown in FIG. 1.

Figure 3:
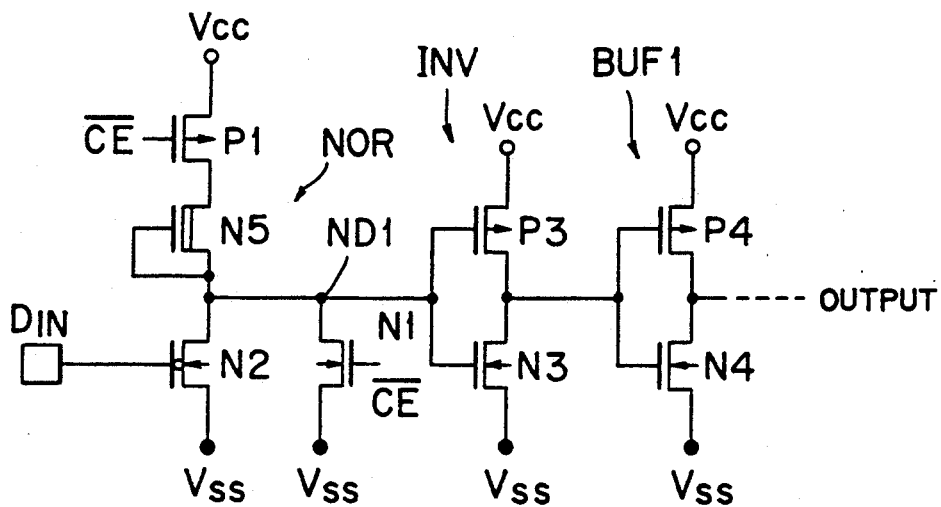
FIG. 3 is a circuit diagram showing a further embodiment of this invention.

FIG. 3 is a circuit diagram showing a further embodiment of this invention. In this embodiment, the P-channel MOS transistor P2 in FIG. 1 is changed to an N-channel depletion type transistor N5 of which gate and source are commonly connected. Since this transistor N5 operates as a load transistor for the transistor N2 in the same manner as in the case of FIG. 1, the same noise reduction effect as that in the case of FIG. 1 can be provided as a whole.

What is claimed is:

1. In a semiconductor integrated circuit comprising, as a portion of an input circuit, a first drive MOS transistor of the N-channel type of which a gate electrode is connected to an external signal input terminal,
the improvement comprises that a threshold voltage of said first drive MOS transistor is set to a value lower than a threshold voltage of a second drive MOS transistor of the N-channel type constituting each of other internal circuits of said integrated circuit.

2. A semiconductor integrated circuit as set forth in claim 1, wherein said threshold voltage of said first drive MOS transistor is set to a value of substantially zero volts or less.

3. A semiconductor integrated circuit as set forth in claim 1, wherein said input circuit further comprises a first MOS transistor of the P-channel type a substantial inversion circuit in which a gate electrode of said first drive MOS transistor and a gate electrode of the first MOS transistor of said P-channel type are commonly connected.

4. A semiconductor integrated circuit as set forth in claim 3, wherein said first drive MOS transistor and said first MOS transistor of said P-channel type constitutes a portion of a NOR gate.

5. A semiconductor integrated circuit as set forth in claim 3, wherein said first drive MOS transistor and said first MOS transistor of said P-channel type constitutes a portion of a NAND gate.

6. A semiconductor integrated circuit as set forth in claim 1, which further comprises, as a load for said first drive MOS transistor, a depletion type MOS transistor of which gate and source are commonly connected.

7. A semiconductor integrated circuit comprising:
a first supply potential terminal;
a second supply potential terminal, providing a second supply potential higher than first supply potential;
an external signal input terminal; and
an input circuit for receiving an input signal and for outputting a signal in response to the input signal applied to the external signal input terminal, the input circuit including:
a first N-channel MOS transistor and a first P-channel MOS transistor,
said first N-channel MOS transistor having a drain, a source and a gate,
the threshold voltage of said first N-channel MOS transistor being nearly zero volts, said gate of said first N-channel MOS transistor being coupled to said external signal input terminal, said source of said first N-channel MOS transistor being coupled to said first supply potential terminal, said first P-channel MOS transistor having a drain, a source and a gate, and said gate of said first P-channel MOS transistor being coupled to said external signal input terminal, said drain of said first P-channel MOS transistor being coupled to said drain of said first N-channel MOS transistor, and said source of said first P-channel MOS transistor being coupled to said second supply potential terminal.

8. A semiconductor integrated circuit according to claim 7, wherein said input circuit further includes a second N-channel MOS transistor and a second P-channel MOS transistor, said second N-channel MOS transistor having a drain, a source and a gate, said drain of said second N-channel MOS transistor being coupled to said drain of said first N-channel MOS transistor, said source of said second N-channel MOS transistor being coupled to said first supply potential terminal, said gate of said second N-channel MOS transistor being controlled by a chip enable signal for controlling operating state;

said second P-channel MOS translator having a drain, a source and a gate, said drain of said second P-channel MOS transistor being coupled to said source of said first P-channel MOS transistor, and said source of said second P-channel MOS transistor being coupled to said second supply potential terminal, said source of said first P-channel MOS translator being coupled to said second supply potential terminal through said second P-channel MOS transistor, and said gate of said second P-channel MOS transistor being controlled by said chip enable signal.

9. A semiconductor integrated circuit according ot claim 7, wherein said input circuit further includes a second P-channel MOS transistor and a second P-channel MOS translator, said second P-channel MOS transistor having a drain, a source and a gate, said drain of said second P-channel MOS transistor being coupled to said drain of said first P-channel MOS transistor, said source of said second P-channel MOS transistor being coupled to said first supply potential terminal, said gate of said second P-channel MOS transistor being controlled by a chip enable signal for controlling operating state;

said second N-channel MOS translator having a drain, a source and a gate, said drain of said second N-channel MOS transistor being coupled to said source of said first N-channel MOS transistor, and said source of said second N-channel MOS transistor being coupled to said second supply potential terminal, said source of said first N-channel MOS transistor being coupled to said first supply potential terminal through said second N-channel MOS transistor, said gate of said second N-channel MOS transistor being controlled by said chip enable signal.

10. A semiconductor integrated circuit comprising:

a first supply potential terminal;

a second supply potential terminal, providing a second supply potential higher than a first supply potential;

an external signal input terminal; and an input circuit for receiving an input signal and for outputting a signal in response to the input signal applied to the external signal input terminal, the input circuit including;

a first N-channel MOS transistor and a second N-channel MOS transistor, said first N-channel MOS transistor having a drain, a source and a gate, the threshold voltage of said first N-channel MOS transistor being nearly zero volts, said gate of said first N-channel MOS transistor being coupled to said external signal input terminal, said source of said first N-channel MOS transistor being coupled to said first supply potential terminal, and said second N-channel MOS transistor being a depletion mode MOS transistor having a drain, a source and a gate, said gate of said second N-channel MOS transistor being coupled to said source of said second N-channel transistor, said source of said second N-channel MOS transistor being coupled to said drain of said first N-channel MOS transistor, said drain of said second N-channel MOS transistor being coupled to said second supply potential terminal.

11. A semiconductor integrated circuit according to claim 10, wherein said input circuit further includes a first P-channel MOS transistor and a third N-channel MOS transistor;

said first P-channel MOS transistor having a drain, a source and a gate, said drain of said first P-channel MOS transistor being coupled to said drain of said second N-channel MOS transistor, said source of said first P-channel MOS transistor being coupled to said second supply potential terminal, said gate of said first P-channel MOS transistor being controlled by a chip enable signal for controlling operating states;

said second N-channel MOS transistor being coupled to said second supply potential terminal through said first P-channel MOS transistor, said third N-channel MOS transistor having a drain, a source and a gate, said drain of said third N-channel MOS transistor being coupled to said drain of said first N-channel MOS transistor, said source of said third N-channel MOS transistor being coupled to said first supply potential terminal, said gate of said third N-channel MOS transistor being controlled by said chip enable signal.

* * * * *